(12) United States Patent
Baldo et al.

(10) Patent No.: US 8,796,059 B2
(45) Date of Patent: Aug. 5, 2014

(54) METHOD OF FORMING ELECTRONIC DEVICE THAT INCLUDES FORMING PROTECTIVE PACKAGE TO HOUSE SUBSTRATE AND DIE ATTACHED THERETO WHILE LEAVING FIRST AND SECOND ACTIVE SURFACE PORTIONS OF THE DIE EXPOSED

(75) Inventors: Lorenzo Baldo, Bareggio (IT); Chantal Combi, Oggiono (IT); Mario Francesco Cortese, Sa Donato Milanese (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 69 days.

(21) Appl. No.: 13/358,318

(22) Filed: Jan. 25, 2012

(65) Prior Publication Data

US 2012/0164775 A1 Jun. 28, 2012

Related U.S. Application Data

(63) Continuation of application No. 12/508,869, filed on Jul. 24, 2009, now Pat. No. 8,134,214, and a continuation-in-part of application No. PCT/EP2008/000495, filed on Jan. 23, 2008.

(30) Foreign Application Priority Data

Jan. 24, 2007 (IT) .............................. MI2007A0099

(51) Int. Cl.
*H01L 21/58* (2006.01)
*H01L 29/84* (2006.01)
(52) U.S. Cl.
USPC ..................... 438/51; 438/53; 257/E29.324
(58) Field of Classification Search
USPC ........................................................ 438/51
See application file for complete search history.

(56) References Cited

U.S. PATENT DOCUMENTS

| 4,763,098 A | 8/1988 | Glenn et al. |
| 5,357,807 A | 10/1994 | Guckel et al. |

(Continued)

FOREIGN PATENT DOCUMENTS

| DE | 4207225 | 9/1993 |
| DE | 10059813 A1 | 6/2002 |

(Continued)

OTHER PUBLICATIONS

European Patent Office, International Search Report, International Application No. PCT/EP2008/000495, Oct. 17, 2008, 6 pages.

(Continued)

*Primary Examiner* — Stephen W Smoot
(74) *Attorney, Agent, or Firm* — Graybeal Jackson LLP

(57) ABSTRACT

Electronic device including a substrate provided with at least one passing opening, a MEMS device with a differential sensor provided with a first and a second surface having at least one portion sensitive to chemical and/or physical variations of fluids present in correspondence with a first and a second opposed active surface thereof. The first surface of the MEMS device leaving the first active surface exposed and the second surface being provided with a further opening which exposes said second opposed active surface, the electronic device being characterized in that the first surface of the MEMS device faces the substrate and is spaced therefrom by a predetermined distance, the sensitive portion being aligned to the passing opening of the substrate, and in that it also comprises a protective package, which incorporates at least partially the MEMS device and the substrate.

12 Claims, 4 Drawing Sheets

(56) References Cited

U.S. PATENT DOCUMENTS

| | | | |
|---|---|---|---|
| 5,923,995 | A | 7/1999 | Kao et al. |
| 5,976,969 | A | 11/1999 | Lin et al. |
| 6,670,686 | B2 | 12/2003 | Jaouen et al. |
| 6,781,231 | B2 | 8/2004 | Minervini |
| 7,166,910 | B2 | 1/2007 | Minervini |
| 7,242,089 | B2 | 7/2007 | Minervini |
| 7,381,589 | B2 | 6/2008 | Minervini |
| 7,382,048 | B2 | 6/2008 | Minervini |
| 7,434,305 | B2 | 10/2008 | Minervini |
| 7,439,616 | B2 | 10/2008 | Minervini |
| 7,501,703 | B2 | 3/2009 | Minervini |
| 7,537,964 | B2 | 5/2009 | Minervini |
| 2004/0032705 | A1 | 2/2004 | Ma |
| 2004/0103724 | A1 | 6/2004 | Takizawa et al. |
| 2005/0253207 | A1 | 11/2005 | Garcia |
| 2007/0201715 | A1 | 8/2007 | Minervini |
| 2007/0215962 | A1 | 9/2007 | Minervini et al. |
| 2009/0121299 | A1* | 5/2009 | Chen et al. .......... 257/419 |
| 2010/0269595 | A1* | 10/2010 | Villa et al. .......... 73/718 |

FOREIGN PATENT DOCUMENTS

| | | | |
|---|---|---|---|
| EP | 1775259 | A1 | 10/2005 |
| JP | 10274583 | | 10/1998 |
| WO | 9805935 | | 2/1998 |
| WO | 0029822 | | 5/2000 |
| WO | 03067657 | | 8/2003 |
| WO | 2006061025 | | 6/2006 |

OTHER PUBLICATIONS

Dirk Hammerschmidt, Frank V. Schnatz, Werner Brockherde, Bedrich J. Hosticka, Ernst Obermeier, "TA 8.3: a CMOS Piezoresistive Pressure Sensor with On-Chip Programming and Calibration", ISSCC 93 / Session 8 /Technology Directions / Paper TA 8.3, 1993 IEEE International Soli-State Circuits Conference, pp. 3.

Werner Herden and Matthias Kusell, Robert Bosch GmbH, "A New Combustion Pressure Sensor for Advanced Engine Management", SAE Technical Paper Series 940379, SAE The Engineering Society for Advancing Mobility Land Sea Air and Space International, International Congress & Exposition Detroit, Michigan, Feb. 28-Mar. 3, 1994, Reprinted from: Electronic Engine Controls 1994 (SP-1029), pp. 10.

Tsutomu Ishihara, Kenichiro Suzuki, Shinobu Suwazono, Masaki Hirata, and Hiroshi Tanigawa, "CMOS Integrated Silicon Pressure Sensor", IEEE Journal of Solid-State Circuits, vol. SC-22, No. 2, Apr. 1987, pp. 151-156.

Tatsuya Itoh, Tadashi Adachi and Hirokazu Hashimoto, "One-Chip Integrated Pressure Sensor", Technical Digest of the 11th Sensor Symposium, 1992, pp. 241-244.

Kazuyuki Kato, Yoshihisa Muramatsu, Hidetoshi Fujimoto and Osamu Sasaki, "Totally Integrated Semiconductor Pressure Sensor", Technical Digest of the 10th Sensor Symposium, 1991, pp. 129-132.

Shiro Yamashita, Keiichi Shimaoka, Hirofumi Funabashi, Susumu Sugiyama, and Isemi Igarashi, "A Fully Integrated Pressure Sensor", Technical Digest of the 8th Sensor Symposium, 1989, pp. 13-16.

\* cited by examiner

METHOD OF FORMING ELECTRONIC DEVICE THAT INCLUDES FORMING PROTECTIVE PACKAGE TO HOUSE SUBSTRATE AND DIE ATTACHED THERETO WHILE LEAVING FIRST AND SECOND ACTIVE SURFACE PORTIONS OF THE DIE EXPOSED

PRIORITY CLAIM

The present application is a Continuation of U.S. patent application Ser. No. 12/508,869 filed Jul. 24, 2009, now U.S. Pat. No. 8,134,214 issued Mar. 13,2012; which application is a Continuation-In-Part of International Application Serial No. PCT/EP2008/000495, filed Jan. 23, 2008, which claims the benefit of Italian Patent Application Serial No. MI2007A000099, filed Jan. 24, 2007; all of foregoing applications are incorporated herein by reference in their entireties.

TECHNICAL FIELD

Embodiments of the present disclosure relate to an electronic device comprising MEMS devices and drilled substrates, in particular of the land grid array (LGA) or ball grid array (BGA) type.

Embodiments of the disclosure particularly, but not exclusively, relate to an electronic device comprising MEMS differential sensors mounted on a LGA substrate, wherein the MEMS differential sensor needs a double physical interface of communication with the environment outside the electronic device and the following description is made with reference to this field of application by way of illustration only.

BACKGROUND

As it is well known, a MEMS device (micro-electro-mechanical system) is a micro device which integrates the mechanical and electrical functions in a silicon chip or die by using the lithographic techniques of micro manufacturing.

In particular, with reference to FIG. 1, a MEMS differential pressure sensor 100 is described which comprises a silicon die 101 formed by an annular portion 102 and a circular or squared membrane 103 coupled to the upper edge of the annular portion 102.

The lower edge of the annular portion 102 is coupled to a protective package 104 of plastic, metallic or ceramic material by means of an adhesive layer 105.

The protective package 104 is formed by a housing, substantially cup shaped housing, which shows an internal cavity 106 wherein the die 101 is mounted. The protective package 104 is also provided with a passing opening 107. When the die 101 is mounted in the cavity 106, the annular portion 102 surrounds the passing opening 107, thereby the passing opening 107 realizes a first access gate of a first pressure P1 onto the lower surface of the membrane 103.

In a conventional way, the protective package 104 is realized through molding before the die 101 is glued inside the cavity 106.

The cavity 106 is then closet on top by a metallic or plastic cover 108 provided with an opening 109 for putting the cavity 106 in communication with the outside of the protective package 104.

In particular, this opening 109 realizes a second access gate for a second pressure P2 onto the upper surface of the membrane 103. The MEMS differential pressure sensor 100 is then able to measure differences of pressure between the first and the second pressure P1, P2.

Moreover, metallic pins 110 project from the protective package 104 for allowing the electric connection of the MEMS differential pressure sensor 100 with the outside of the protective package 104.

Connections 111 for electrically connecting the die 101 with the metallic pins 110 of the cavity 106 are realized though wire bonding, after the die 101 has been fixed in the cavity 106.

A protective coating layer 112, generally silicon gel, fills in almost completely the cavity 106.

In other known embodiments, also the cover 108 is formed through molding and coupled to the protective package 104 after that the MEMS differential pressure sensor 100 has been fixed in the cavity 106 and electrically coupled to the pins 111.

Although advantageous under several aspects, these embodiments of the assembled electronic devices comprising MEMS differential pressure sensor show the drawback of being cumbersome since the cavity 106 should be wide enough for housing the die 101 and allowing the alternative connection operations through wire bonding.

Therefore the manufacturing of these devices provides the following steps: manufacturing of the protective package 104 and of the cover 108, mounting and electric connection of the die 101 inside the protective package 104, mounting of the cover 108 on the protective package 104.

Since these process steps are not provided in the conventional process flow for the realization of integrated circuits cause a considerable increase of the costs of the final device.

The technical problem underlying embodiments of the present disclosure is that of devising an electronic device comprising MEMS differential sensor devices, having such structural characteristics as to realize this electronic device with manufacturing processes of conventional integrated circuits, overcoming the limits and/or drawbacks still limiting conventional electronic devices.

SUMMARY

A first embodiment of the present disclosure relates to an electronic device comprising a substrate having at least one passing opening; a differential sensor MEMS device having at least a first and a second surface leaving exposed a first and second active surface, respectively; a protective package incorporating at least partially said MEMS device and said substrate so as to leave exposed said first and second active surfaces; said differential sensor being sensitive to chemical and/or physical variations of fluids getting in contact with said first and/or second active surface; said first surface of said MEMS device facing said substrate and being spaced from said substrate by a distance; said second surface being opposed to said first surface and having an opening for exposing said second active surface; said sensitive portion being aligned with said passing opening of said substrate.

The characteristics and the advantages of the electronic device according to embodiments of the disclosure will be apparent from the following description of an embodiment thereof given by way of indicative and non limiting example with reference to the annexed drawings.

DETAILED DESCRIPTION

The following discussion is presented to enable a person skilled in the art to make and use the disclosure. Various modifications to the embodiments will be readily apparent to those skilled in the art, and the generic principles herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Figure 1:
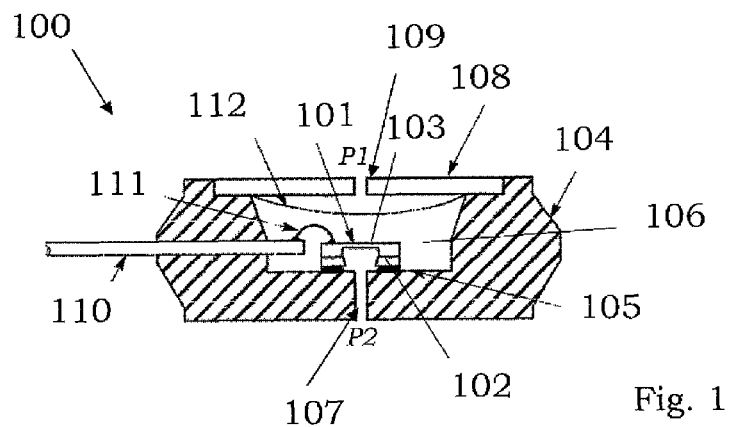
FIG. 1 is a sectional view of an embodiment of an electronic device comprising conventional MEMS differential pressure sensor devices.
Figure 2:
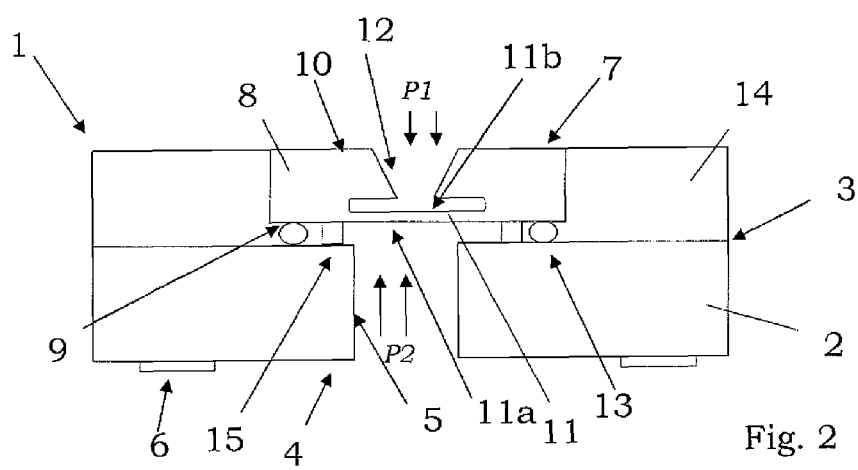
FIG. 2 is a sectional view of an electronic device comprising MEMS devices according to an embodiment of the disclosure.

With reference to FIG. 2, a first embodiment is shown of an electronic device 1 for MEMS differential sensor devices according to embodiments of the disclosure which comprises a substrate 2, for example of the LGA/BGA type, having an upper surface 3 and a lower surface 4 opposed to the upper surface 3, provided with a passing opening 5 between these two surfaces 3, 4.

In a known way a substrate of the LGA/BGA type is formed by conductive layers insulated from each other by means of layers of insulating or dielectric material. The conductive layers are conformed in conductive tracks insulated form each other by layers of insulating or dielectric material. Conductive holes, called "vias", are typically realized through the insulating layers with a vertical orientation with respect to the layers, to form conductive paths between conductive tracks belonging to different conductive layers.

Moreover, lands 6, coupled to conductive tracks present on the lower surface 4, are present on the lower surface 4 of the substrate 2.

The electronic device 1 also comprises a MEMS differential sensor device 7 comprising a die 8, for example of silicon, having a first surface 9 and a second surface 10 opposed to the first surface 9. On the first surface 9 a sensitive portion 11 of the MEMS differential sensor device 7 is integrated which leaves a first active surface 11a of the sensitive portion 11 exposed, while the second surface 10 is provided with an opening 12 which exposes a second active surface 11b, opposed to the first active surface 11a, of the sensitive portion 11.

According to embodiments of the disclosure, the first surface 9 of the MEMS differential sensor device 7 faces the upper surface 3 of the substrate 2 and is spaced therefrom by a determined distance and the sensitive portion 11 aligned to the opening 5.

Moreover, the peripheral portion of the first surface 9 of the MEMS differential sensor device 7 is provided with lands for the electric connection to conductive tracks present on the upper surface 3 of the substrate 2, by means of electric connections 13, for example bumps.

Advantageously, the MEMS differential sensor device 7 is electrically mounted on the substrate 2 by means of the known "flip-chip" assembling method.

Still according to embodiments of the disclosure, the electronic device 1 comprises a protective package 14, realized through molding, which incorporates the MEMS differential sensor device 7, the electric connections 13 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14 leaves also the lower surface 4 of the substrate 2 exposed.

Advantageously, the second surface 10 of the MEMS differential sensor device 7 is flanked to an upper surface of the protective package 14.

According to embodiments of the disclosure, the sensitive portion 11 is sensitive to chemical and/or physical variations of fluids present on or getting in contact with the two active surfaces 11a, 11b of the sensitive portion 11. The fluids can be at least two, in such a case a first fluid interacts with the first active surface 11a of the sensitive portion 11 of the MEMS differential sensor device 7 through the passing opening 5, and the second fluid interacts with the second active surface 11b of the sensitive portion 11 of the MEMS differential sensor device 7 through the opening 12 provided on the second surface 10.

Advantageously, a barrier element 15 is positioned between the first surface 9 of the MEMS differential sensor device 7 and the upper surface 3 of the substrate 2 so as to surround said sensitive portion 11.

Advantageously according to embodiments of the disclosure, the presence of this barrier element 15 protects the sensitive portion 11 during the manufacturing process of the protective package 14, though molding, so that this sensitive portion 11 remains free.

In fact, in a known way, the formation of the protective package 14 provides the introduction, inside a cavity of a mold, of the substrate 2 whereon the MEMS differential sensor device 7 is mounted.

In the mold cavity the injection is then provided, under pressure and at high temperature, of an electrically insulating material being melted, which will constitute the plastic body of the protective package 14. This material is typically a synthetic resin, for example an epoxy resin.

The proper molding step involves the injection of the resin into the cavity of the mold. This step is then followed by a cooling step for completing the protective package 14.

For avoiding that the resin damages the sensitive portion 11 of the MEMS differential sensor device 7 during the injection step of the resin, according to embodiments of the disclosure, between the upper surface 3 of the substrate 2 and the first surface 9, the barrier element 15 is provided which completely surrounds at least the sensitive portion 11 of the MEMS differential sensor device 7.

Advantageously, the barrier element 15 is a ring which completely surrounds the sensitive portion 11 of the MEMS device 7, when the MEMS device 7 is mounted on the substrate 2, and contacts the upper surface 3 of the substrate 2 and the first surface 9 of the MEMS differential sensor device 7.

Advantageously, the barrier element 15 is formed by a welding paste, thereby, in this embodiment, the electric connection step and the gluing step of the MEMS differential sensor device 7 to the substrate 2 are carried out at the same time, resulting in a particularly compact structure of simple realization, not needing critical alignments between different structures.

Moreover, the external edge of this barrier element 15 is, for example, completely incorporated in the protective package 14.

Figure 3:
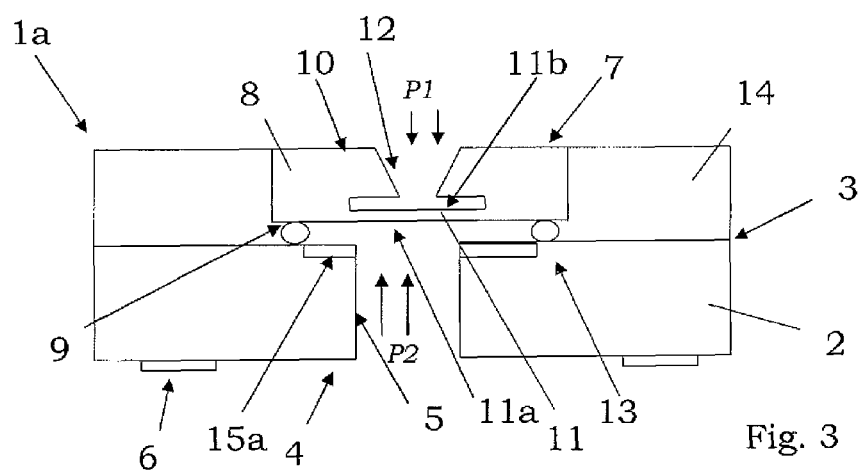
FIG. 3 is a sectional view of a first version of the electronic device of FIG. 2.

With reference to FIG. 3, a first embodiment is shown of an electronic device 1a according to embodiments of the disclosure.

Elements being structurally and functionally identical with respect to the electric device described with reference to FIG. 2 will be given the same reference numbers.

Advantageously, a barrier element 15a is positioned at least in an area which surrounds the sensitive portion 11.

In this first embodiment, the barrier element 15a is an irregular area 15a formed on the upper surface 3 of the substrate 2.

Advantageously, this irregular area 15a shows a corrugated surface.

Advantageously, this irregular area 15a extends on the upper surface 3 of the substrate 2 in correspondence with the whole central free area.

Advantageously, according to embodiments of the disclosure this irregular area 15a is obtained by modifying the chemical properties of the upper surface 3 of the substrate 2, as shown in FIG. 3.

Advantageously, the irregular area 15a is formed by a non wettable material.

Nothing forbids that this layer 15a of non wettable material is formed on the upper surface 3 of the substrate 2.

Figure 4:
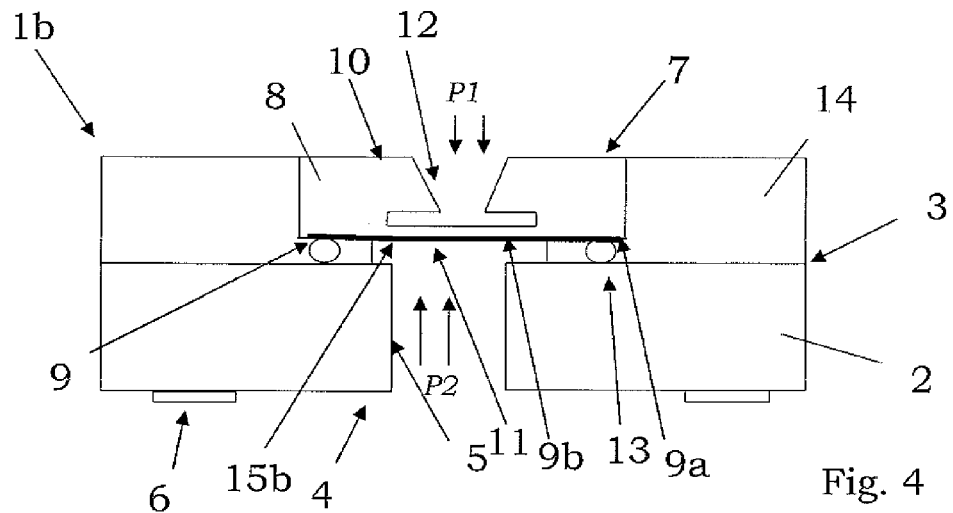
FIG. 4 is a sectional view of a second version of the device of FIG. 2.

With reference to FIG. 4, a second version of the embodiment of an electronic device 1b according to embodiments of the disclosure is shown.

Elements being structurally and functionally identical with respect to the device 1 described with reference to FIG. 2 will be given the same reference numbers.

Advantageously, a barrier element 15b is positioned at least in an area which surrounds the sensitive portion 11.

In this second version, the barrier element 15b is an irregular area 15b formed on the first surface 9 of the MEMS differential sensor device 7 and is obtained by modifying the chemical properties of the first surface 9 of the MEMS differential sensor device 7.

Advantageously, this irregular area 15b extends on the first surface 9 of the MEMS differential sensor device 7 in correspondence with the whole sensitive portion 11 of the MEMS differential sensor device 7.

It is in fact known that a silicon die 8, at least in correspondence with the first surface 9 of a MEMS differential sensor device 7, is coated by an insulating layer 9b of the non wettable type coated by a protection layer 9a comprising wettable material for example a plastic layer, for example comprising organic material such as Polyimide.

Advantageously, at least in correspondence with the sensitive portion 11 of the MEMS differential sensor device 7, the layer of wettable material 9a is removed leaving the insulating layer 9b, for example formed by silicon oxide, exposed.

Advantageously, after the removal step from the sensitive portion 11 of the MEMS differential sensor device 7 of the layer 9a of wettable material, the MEMS differential sensor device is welded onto the substrate 2 and is subjected to a cleaning operation, for example in Plasma, by using a gas mixture including argon and oxygen.

Advantageously, the oxygen of the cleaning mixture chemically reacts with the layer 9a of wettable material increasing the wettability, while the dielectric layer 9b which coats the sensitive portion 11 is inert to the treatment.

Therefore, as result after the treatment, an increased wettability is obtained of the layer 9a of wettable material, comparable to that of the upper surface 3 of the substrate 2 and a reduced wettability of the surface of the dielectric layer 9b which coats the sensitive portion 11.

This wettability difference implies a sudden slow down of the resin flow during the molding step of the protective package 14 thereby the superficial voltage of the resin leads to the formation of a meniscus around the peripheral surface of the dielectric layer 9b which covers the sensitive portion 11.

Nothing forbids that a barrier layer 9b of non wettable material is formed not only on the first surface 9 of the MEMS device, but also on the upper layer 3 of the substrate 2 aligned to the sensitive portion 11.

In a further version of these two latter embodiments of the disclosure the irregular area 15a, 15b shows wrinkles.

Advantageously, in the irregular area 15a, 15b trenches are formed, made in the substrate or in the MEMS differential sensor device 7, so as to realize a preferred path defined in the substrate 2 or on the MEMS differential sensor device 7 for the resin during the molding step.

Advantageously, these trenches completely surround the sensitive portion 11 of the MEMS device 7, as shown for example in the device 1c of FIG. 5, wherein elements being structurally and functionally identical with respect to the device 1 described with reference to FIG. 2 have been given the same reference numbers.

Advantageously, in this latter embodiment a layer of non wettable material can be present in correspondence with the sensitive portion 11 of the MEMS differential sensor device 7 in correspondence with the area enclosed by the trenches, both on the substrate 2 and on the MEMS differential sensor device 7.

According to embodiments of the disclosure, the presence of this irregular area 15a, 15b protects the sensitive portion 11 during the manufacturing step of the protective package 14, through molding, so that the liquid resin is uniformly distributed around the electric connections without reaching the sensitive portion 11.

Figure 6:
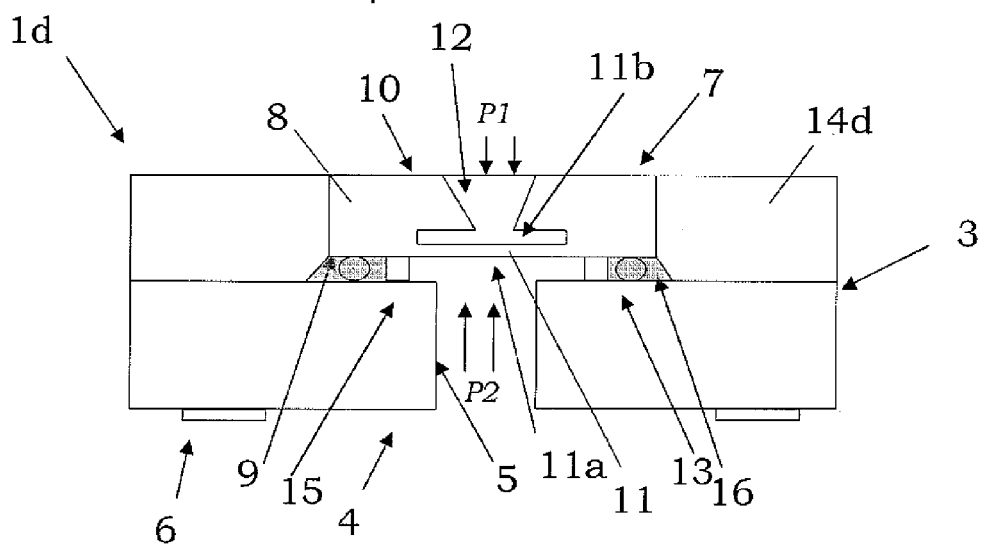
FIG. 6 is a sectional view of an electronic device comprising MEMS devices according to a second embodiment of the disclosure.

With reference to FIG. 6, a second embodiment of an electronic device 1d according to embodiments of the disclosure is shown.

Elements being structurally and functionally identical with respect to the device 1 described with reference to FIG. 2 will be given the same reference numbers.

In particular in this embodiment an underfiller 16 incorporates the electric connections 13 to mechanically strengthen the electronic device 1 in the connection area between the MEMS differential sensor device 7 and the substrate 2.

Advantageously, the underfiller 16 is formed by epoxy compounds, for example epoxy resin.

Advantageously, a barrier element 15 can be provided between the MEMS differential sensor device 7 and the substrate 2.

Advantageously, the underfiller 16 shows a tapered profile outwards of the MEMS differential sensor device 7, while it shows a substantially vertical profile in correspondence with the barrier element 15.

In other words, the cross section of the underfiller 16 increases when approaching the upper surface 3 of the substrate 2.

The electronic device 1d also comprises a protective package 14d, realized through molding, which incorporates the MEMS differential sensor device 7, the underfiller 16 and the substrate 2, leaving the first active surface 11a of the sensitive portion 11 of the MEMS differential sensor device 7 exposed through the passing opening 5 of the substrate 2 and the second active surface 11b exposed through the opening 12 of the second surface 10.

Advantageously, the protective package 14d leaves also the lower surface 4 of the substrate 2 exposed.

Advantageously, the second surface 10 is flanked to an upper surface of the protective package 14d.

The presence of the barrier element 15 allows maintaining the sensitive portion 11 of the MEMS differential sensor device 7 free from the underfiller 16.

Moreover, the underfiller 16 protects the first surface 9 of the MEMS differential sensor device 7 during the manufacturing step of the plastic package 14d.

Advantageously, the underfiller 16 is present outside the barrier element 15a, 15b of the embodiments described with reference to FIGS. 3, 4 and 5, at least in the area comprised between the upper surface 3 of the substrate 2 and the first surface 9 of the MEMS differential sensor device 7 so as to incorporate the electric connections 13 for mechanically strengthen the electronic device 1 in the connection area between the MEMS differential sensor device 7 and the substrate 2.

Figure 7:
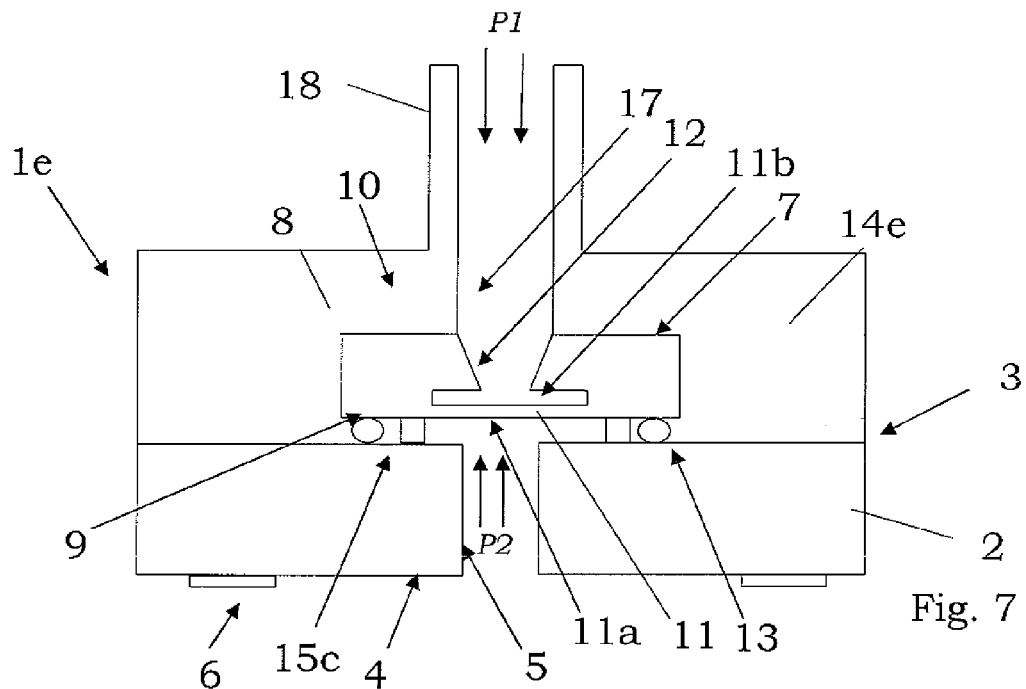
FIG. 7 is a sectional view of an electronic device comprising MEMS devices according to a third embodiment of the disclosure.

With reference to FIG. 7, a third embodiment of an electronic device 1e according to embodiments of the disclosure is shown.

Elements being structurally and functionally identical with respect to the device 1 described with reference to FIG. 2 will be given the same reference numbers.

The electronic device 1e also comprises a protective package 14e, realized through molding, which incorporates the MEMS differential sensor device 7 and the substrate 2, leaving the first active surface 11a of the sensitive portion 11 of the MEMS differential sensor device 7 exposed through the passing opening 5, and advantageously, the lower surface 4 of the substrate 2. The protective package 14e coats the second surface 10 of the MEMS differential sensor device 7 and is provided with a further passing opening 17 aligned to the opening 12 present on the second surface 10 of the MEMS differential sensor device 7.

Advantageously, a cylindrical projection 18 is formed on the passing opening 17 of the protective package 14e to facilitate the access to the sensitive portion 11 of the MEMS differential sensor device 7.

Advantageously, this cylindrical projection 18 is realized simultaneously with the protective package 14e during the same molding step in which this package is formed.

Advantageously, a barrier element 15 can be provided between the MEMS differential sensor device 7 and the substrate 2.

Figure 5:
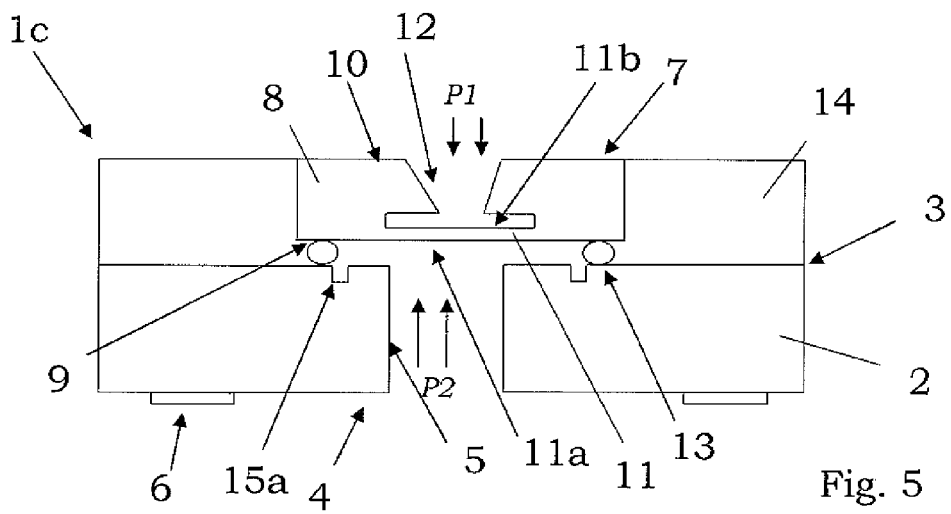
FIG. 5 is a sectional view of a third version of the device of FIG. 2.

Advantageously, also in this embodiment of the disclosure the barrier elements 15a and 15b shown with reference to FIGS. 3 to 5 or an underfiller 16 like the one shown with reference to FIG. 6 can be provided.

Figure 8:
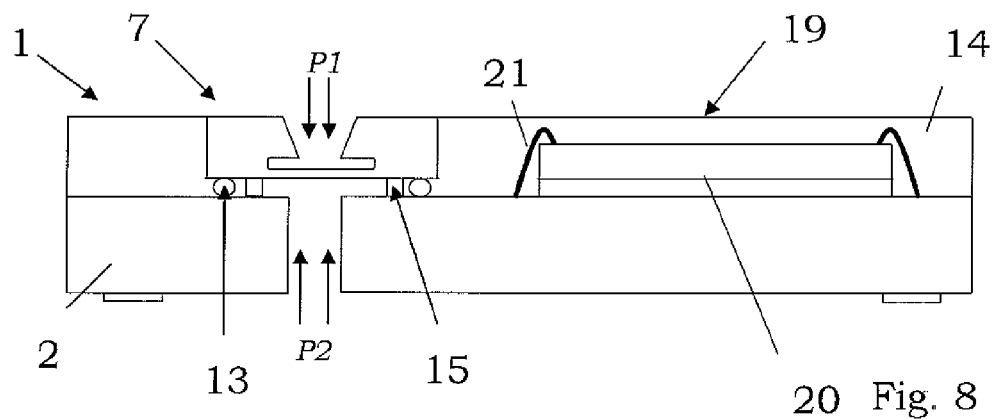
FIGS. 8 and 9 are sectional views of applications of the electronic devices comprising MEMS devices realized according to embodiments of the disclosure.

With reference to FIG. 8, the device 1 of FIG. 2 is shown wherein an integrated circuit 19 is mounted on the substrate 2 flanked to the MEMS differential sensor device 7, and fixed onto the substrate 2, for example by means of a welding layer 20.

The integrated circuit 19 is electrically coupled to the substrate 2 by means of further electric connections 21.

The protective package 14, realized through molding, incorporates the MEMS differential sensor device 7 with the electric connections 13, the integrated circuit 19 with the further electric connections 21 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14 leaves also the lower surface 4 of the substrate 2 exposed.

Advantageously, the second surface 10 of the MEMS differential sensor device 7 is flanked to an upper surface of the protective package 14.

Figure 9:
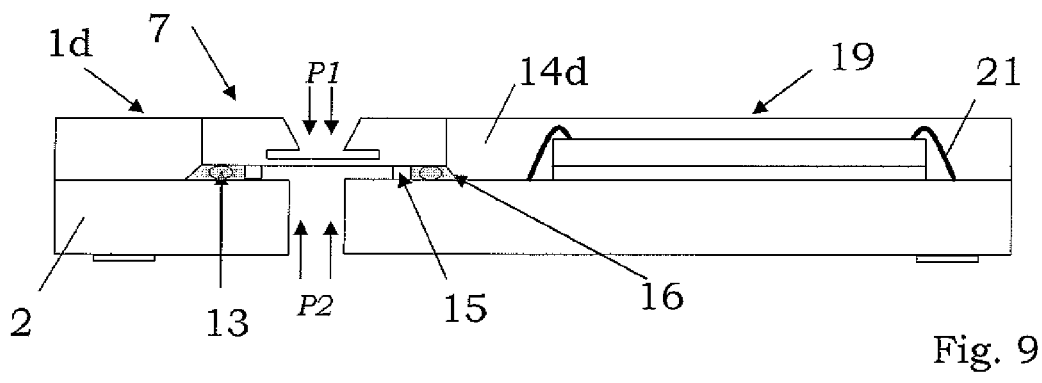

With reference to FIG. 9, the device 1d of FIG. 6 is shown wherein an integrated circuit 19 is mounted on the substrate 2 flanked to the MEMS differential sensor device 7, and fixed onto the substrate 2, for example by means of a welding layer 20.

The integrated circuit 19 is electrically coupled to the substrate 2 by means of further electric connections 21.

The protective package 14d, realized through molding, incorporates the MEMS differential sensor device 7, the underfiller 16, the integrated circuit 19 with the further electric connections 21 and the substrate 2, leaving the first active surface 11a of the sensitive portion 11 of the MEMS differential sensor device 7 exposed through the passing opening 5 and the second active surface 11b of the sensitive portion 11 exposed through the opening 12 of the second surface 10.

Advantageously, the protective package 14d leaves also the lower surface 4 of the substrate 2 exposed.

Advantageously, the second surface 10 of the MEMS differential device 7 is flanked to the upper surface of the protective package 14d.

Figure 10:
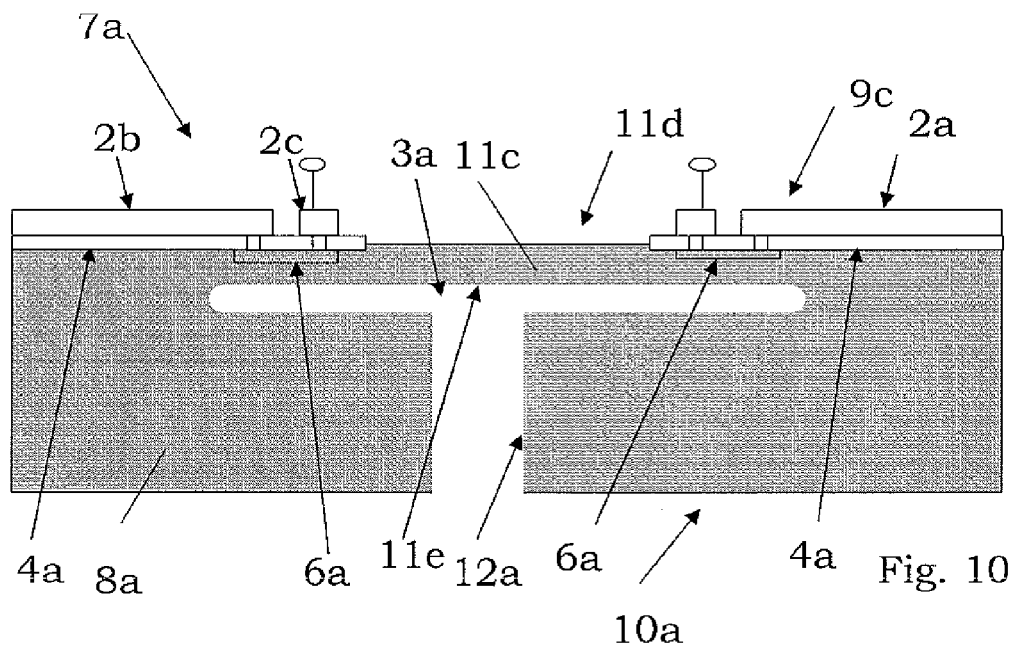
FIGS. 10 and 11 are sectional views of known MEMS differential pressure sensors.
Figure 11:
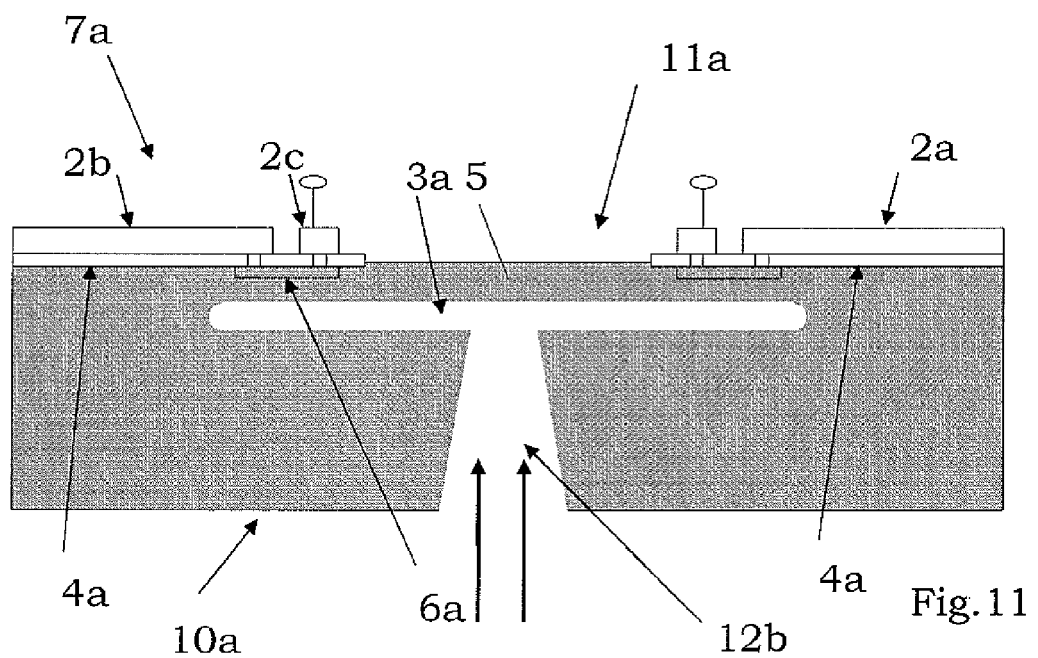

Advantageously, the MEMS differential sensor device 7 used in the devices according to embodiments of the disclosure is a differential pressure sensor device shown in FIGS. 10 and 11.

In particular, with reference to these figures, a differential pressure sensor 7a is shown formed in a semiconductor die 8a, for example of silicon.

In the semiconductor die 8a a cavity 3a is realized next to a first surface 9c of the semiconductor die 8a.

The portion of the semiconductor die 8a comprised between the cavity 3a and the first surface 9c forms a membrane 11c, i.e. the sensitive element of the pressure sensor 7a.

Resistive elements 6a are formed in the peripheral portion of the membrane 11c next to the first surface 9c.

An insulating layer 4a, for example oxide, coats the first active surface 9c of the die 2a, leaving a first active surface 11d of the membrane 11c, comprised between the resistive elements 6a, exposed. Moreover, openings are provided in the insulating layer 4a in correspondence with these resistive elements 6a for allowing the electric connection to a conductive layer 2a which is formed on the insulating layer 4a.

Nothing forbids that the insulating layer coats the whole active surface 9c of the die 2a.

Advantageously, a passivation layer coats the first active surface 9c of the die 2a.

In particular, the conductive layer 2a comprises two portions 2b and 2c separated from each other and electrically coupled through the resistive elements 6a.

An opening 12a, 12b is provided in a second surface 10a of the sensor 7a, opposed to the first surface 9c, which puts the cavity 3a in communication with the outside of the sensor 7a. In this way the opening 12a, 12b realizes an access gate for a second pressure which acts on the second active surface 11e of the membrane 11c which is faced in the cavity 3a.

As shown in FIG. 10, if the opening 12a is realized through a dry etching, the walls of the opening 12a are substantially perpendicular with respect to the second surface 10a, i.e. the cross dimensions of the opening 12a are substantially constant.

As shown in FIG. 11 instead, if the opening 12b is realized through an etching of the wet type the walls of the opening 12b are tapered, i.e. the cross dimensions of the opening 12b decrease when departing from the second surface 10a.

In conclusion, with the device according to embodiments of the disclosure it is possible to realize microphones, pressure, gas, chemical differential sensors, which are encapsulated in a protective package realized through molding.

According to embodiments of the disclosure it is also possible to integrate more sensors (accelerometers and pressure sensors) in the same protective package 14. These packages can be contained in a variety of different types of electronic systems, such as vehicle safety systems, portable electronic devices like cellular phones and PDAs, video game controllers, computer systems, control systems, and so on.

Advantageously, in a preferred embodiment, the overall electronic device 1, 1a, 1b, 1c, 1d, 1e, 1e shows a space comprised between 3×3×1 mm^3, while the MEMS differential sensor device 7 shows a width of 1500 μm a length of 1500 μm and a thickness 700 μm and shows an opening 12 on the second surface 10 comprised between 100 and 500 μm.

The sensitive portion 11 of the MEMS differential sensor device 7 is of circular or squared shape and has a diameter/side comprised between 100 μm and 1000 μm.

The distance between the first surface 9 of the MEMS differential sensor device 7 and the upper surface 3 of the substrate is comprised between 50 and 500 μm, while the thickness of the substrate 2 is comprised between 150 and 300 μm, while the width of the opening 5 is comprised between 100 and 700 um.

If the barrier element 15 is realized by a ring of welding paste it has a thickness of a cross section comprised between 60 and 300 μm.

If the barrier element 15a, 15b is realized by an irregular area, it has a width of a cross section comprised between 10 and 50 μm and for example a depth comprised between 20 and 80 μm.

In conclusion, the electronic device according to embodiments of the disclosure is particularly compact and uses technical solutions which do not provide critical alignments.

Advantageously, the presence of the barrier element 15, 15a, 15b allows protection of the sensitive portion 11 of the MEMS differential sensor device 7 during the manufacturing steps of the protective package 14 or during the dispensing step of the underfiller 16 in the electronic device 1 according to embodiments of the disclosure.

Advantageously, this barrier element 15, 15a, 15b can be of physical or chemical nature or a combination of the two and can be realized both on the substrate 2 and on the MEMS differential sensor device 7.

From the foregoing it will be appreciated that, although specific embodiments of the disclosure have been described herein for purposes of illustration, various modifications may be made without deviating from the spirit and scope of the disclosure.

The invention claimed is:

1. A method of forming an electronic device, comprising:

forming an opening in a substrate having a plurality of electrically conductive layers;

physically attaching a die to the substrate to position a first active surface portion of the die adjacent the opening of the substrate and, through this physical attachment, electrically connecting the die to at least some of the electrically conductive layers in the substrate, the die further including a second active surface portion exposed through an opening of the die;

forming a protective package to house the substrate and the die, the protective package leaving the opening of the substrate and the opening of the die exposed; and forming a barrier element surrounding the opening of the substrate, the barrier element comprising a ring in contact with the substrate and the die, and whose external edge is completely coated by the protective package;

wherein the barrier element is formed from welding paste.

2. The method of claim 1 wherein the operation of physically attaching the die to the substrate comprises flip-chip bonding the die to the substrate to thereby provide the physical attachment and electrical interconnection between the die and the electrically conductive layers of the substrate.

3. A method of forming an electronic device, comprising:

forming an opening in a substrate having a plurality of electrically conductive layers;

physically attaching a die to the substrate to position a first active surface portion of the die adjacent the opening of the substrate and, through this physical attachment, electrically connecting the die to at least some of the electrically conductive layers in the substrate, the die further including a second active surface portion exposed through an opening of the die; and forming a protective package to house the substrate and the die, the protective package leaving the opening of the substrate and the opening of the die exposed;

the method further comprising forming a barrier element surrounding the opening of the substrate, the barrier element comprising an irregular shape in contact with the substrate and the die, and whose external edge is completely coated by the protective package.

4. The method of claim 3 wherein the barrier element forms an irregular area that extends on an upper surface of the substrate to match a sensitive portion of the die.

5. The method of claim 4, wherein this irregular area is formed by modifying the chemical properties of the upper surface of the substrate.

6. The method of claim 4, wherein this irregular area is formed by non-wettable material.

7. A method of forming an electronic device, comprising:

forming an opening in a substrate having a plurality of electrically conductive layers;

physically attaching a die to the substrate to position a first active surface portion of the die adjacent the opening of the substrate and, through this physical attachment, electrically connecting the die to at least some of the electrically conductive layers in the substrate, the die further including a second active surface portion exposed through an opening of the die; and forming a protective package to house the substrate and the die, the protective package leaving the opening of the substrate and the opening of the die exposed;

the method further comprising:
coating the die with a non-wettable insulating layer and a protection layer, and
forming a barrier element having an irregular area between the substrate and the die by removing the protection layer from the die and exposing the non-wettable insulating layer.

8. The method of claim 7, wherein coating the die further comprises coating the die with a polyimide protection layer and with an oxide non-wettable material.

9. A method of forming an electronic device, comprising:
forming an opening in a substrate having a plurality of electrically conductive layers;
physically attaching a die to the substrate to position a first active surface portion of the die adjacent the opening of the substrate and, through this physical attachment, electrically connecting the die to at least some of the electrically conductive layers in the substrate, the die further including a second active surface portion exposed through an opening of the die; and
forming a protective package to house the substrate and the die, the protective package leaving the opening of the substrate and the opening of the die exposed;
the method further comprising forming a cylindrical projection on the opening of the substrate to facilitate the access to the first active surface of the die.

10. A method of forming an electronic device, comprising:
forming an opening in a substrate having a plurality of electrically conductive layers;
physically attaching a die to the substrate to position a first active surface portion of the die adjacent the opening of the substrate and, through this physical attachment, electrically connecting the die to at least some of the electrically conductive layers in the substrate, the die further including a second active surface portion exposed through an opening of the die:
forming a protective package to house the substrate and the die, the protective package leaving the opening of the substrate and the opening of the die exposed;
forming a barrier element surrounding the opening of the substrate, the barrier element comprising a ring in contact with the substrate and the die, and whose external edge is completely coated by the protective package; and
forming electric connections to electrically couple the die to the substrate outside the barrier element with respect to the first active surface.

11. The method of claim 10, further comprising forming an underfiller that incorporates the electric connections.

12. The method of claim 11, wherein forming an underfiller that incorporates the electric connections further comprises forming bumps on the electric connections.

* * * * *